(12) United States Patent  
Dupre

(10) Patent No.: US 9,105,551 B2  
(45) Date of Patent: Aug. 11, 2015

(54) METHOD FOR MAKING AN IMAGER DEVICE

(71) Applicant: COMMISSARIAT A L'ENERGIE ATOMIQUE ET AUX ENE ALT, Paris (FR)

(72) Inventor: Cecilia Dupre, Bonsecours (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/178,764

(22) Filed: Feb. 12, 2014

(65) Prior Publication Data

US 2014/0235009 A1    Aug. 21, 2014

(30) Foreign Application Priority Data

Feb. 18, 2013   (FR) ..................... 13 51357

(51) Int. Cl.
| | |
|---|---|
| *H01L 21/00* | (2006.01) |
| *H01L 27/146* | (2006.01) |
| *G01J 5/02* | (2006.01) |
| *G01J 5/08* | (2006.01) |
| *G01J 5/20* | (2006.01) |

(52) U.S. Cl.
CPC ........... *H01L 27/14689* (2013.01); *G01J 5/024* (2013.01); *G01J 5/0809* (2013.01); *G01J 5/0837* (2013.01); *G01J 5/20* (2013.01)

(58) Field of Classification Search
USPC .......................................................... 438/72
See application file for complete search history.

(56) References Cited

U.S. PATENT DOCUMENTS

| | | |
|---|---|---|
| 2008/0035847 A1 | 2/2008 | Honda et al. |
| 2008/0237469 A1 | 10/2008 | Oda et al. |
| 2012/0091342 A1 | 4/2012 | Berger et al. |
| 2012/0211858 A1 | 8/2012 | Tsuchiya |

FOREIGN PATENT DOCUMENTS

| | | |
|---|---|---|
| WO | 2010/007266 A1 | 1/2010 |
| WO | WO 2010/007266 A1 | 1/2010 |
| WO | 2010/076783 A1 | 7/2010 |

(Continued)

OTHER PUBLICATIONS

French Preliminary Search Report issued Sep. 10, 2013, in Patent Application No. FR 1351357, filed Feb. 18, 2013 (with English Translation of Category of Cited Documents).

(Continued)

*Primary Examiner* — Marvin Payen  
(74) *Attorney, Agent, or Firm* — Oblon, McClelland, Maier & Neustadt, L.L.P.

(57) ABSTRACT

A method for making an imager device including the implementation of the steps of:
  making, through a layer of electric insulating material within which are made one or more pixels each including an antenna able to pick up an electromagnetic wave received at said pixel, of an aperture forming an access to a layer of sacrificial material provided between the layer of electric insulating material and a reflective layer able to reflect said electromagnetic wave;
  removing part of the layer of sacrificial material through the aperture, forming between the reflective layer and the layer of electric insulating material at least one optical cavity.

16 Claims, 6 Drawing Sheets

(56) References Cited

FOREIGN PATENT DOCUMENTS

| WO | WO 2010/076783 A1 | 7/2010 |
| WO | WO 2011/048170 A1 | 4/2011 |
| WO | 2011/151756 A2 | 12/2011 |
| WO | WO 2011/151756 A2 | 12/2011 |

OTHER PUBLICATIONS

Frank Niklaus, "MEMS-Based Uncooled Infrared Bolometer Arrays—A Review", Proceedings of SPIE, vol. 6836, 2007, pp. 68360D-1 to 68360D-15.

METHOD FOR MAKING AN IMAGER DEVICE

TECHNICAL FIELD

The invention relates to the field of imager devices, for example that of Terahertz (THz) imager devices. The invention is in particular applicable to making such imager devices in MOS technology.

STATE OF PRIOR ART

The THz radiation is non-ionizing and is thus considered non-hazardous. This radiation is also penetrating and can thus be used in the field of medical imaging or even in the field of safety imaging (for example for the purpose of detecting objects hidden behind clothes).

THz imaging is a passive imaging which consists in detecting waves directly emitted by the observed elements. An observed element emits waves different according to the temperature of the element which behaves, regarding a THz imager device, as a black body. Thus, with a THz imager device, it is not necessary to illuminate or irradiate what it is desired to be observe or detect.

A technique of making a THz imager device consists in making different elements of the imager device in CMOS technology on a semiconductor substrate, and then implementing so-called post-processing steps, in order to thermally insulate the detectors, or sensors, from the pixels of the imager device.

Each pixel of the imager device includes for example a heat antenna, that is an antenna which collects an electromagnetic radiation and which converts it into heat. This variation in temperature is then detected by the pixel sensor, which sensor can for example be a bolometer, a diode or a MOS transistor (operating for example in sub-threshold regime), as described for example in document WO 2011/151756 A2. The sensor is in this case a heat sensor able to convert a temperature variation emitted by the antenna into an electrical variation of a signal.

Alternatively, it is possible that the antenna of a pixel of the imager device be capacitively coupled to a resistive element which emits heat the intensity of which is a function of the electromagnetic radiation detected by the antenna. This variation in temperature is then detected by the pixel sensor, as described in document WO 2011/048170 A1.

Document WO 2010/076783 A1 further describes the implementation of post-processing steps from unit chips for making THz imager devices.

In order to increase the efficiency of the receiving antenna, document WO 2011/151756 A2 suggests to add, under the antenna of each pixel of the imager device, an electromagnetic wave reflector provided at a distance equal to $\lambda/4$ with respect to the antenna, with $\lambda$ corresponding to the incident wavelength intended to be detected by the antenna. Makin such a reflector is however complex and expensive to implement.

DISCLOSURE OF THE INVENTION

Thus there is a need to provide a method for making an imager device including electromagnetic wave reflectors coupled to the pixels of the imager device, which is less complex and expensive to implement than methods of prior art.

For this, one embodiment provides a method for making an imager device including at least the implementation of the steps of:

making, through at least one layer of electric insulating or dielectric material within which are made one or more pixels each including at least one antenna able to pick up at least one electromagnetic wave received at said pixel, of at least one aperture forming an access to at least one layer of sacrificial material provided between the layer of electric insulating material and at least one reflective layer able to reflect said electromagnetic wave;

removing at least part of the layer of sacrificial material through the aperture, forming between the reflective layer and the layer of electric insulating material at least one optical cavity.

This method according to the invention thus proposes to resort to a substrate including a buried reflective layer readily accessible via etching a layer of sacrificial material provided under the one or more pixels of the imager device. The reflective layer can then form the reflector(s) optically coupled to the one or more pixels of the imager device.

The reflective layer and the layer of electric insulating material may be spaced out by a distance equal to about $\lambda/4n$, with n corresponding to the refractive index of a medium in the optical cavity, and $\lambda$ corresponding to the wavelength of the electromagnetic wave. This method thus enables the distance between the reflective layer and the one or more pixels to be readily controlled because this distance $\lambda/4n$ can be defined by controlling the thickness of the layer of sacrificial material. Such a distance allows to have an optical cavity in which constructive interferences are produced at the antenna of the one or more pixels. This distance may be obtained by making the layer of sacrificial material such that its thickness is equal to about $\lambda/4n$.

The antenna of the one or of each pixel may be coupled to at least one electronic sensor of said pixel.

The electronic sensor of the one or of each pixel may include at least one bolometer, or a diode or a transistor, for example of the MOS type.

The method may further include, prior to making the aperture through the layer of electric insulating material, making the one or more pixels in CMOS technology.

The layer of electric insulating material may include a stack of several interlayer insulating layers (ILD). These ILD layers may cover the different semiconductor and metal elements of the one or more pixels made in MOS technology.

The method may further include, between making the one or more pixels and making the aperture through the layer of electric insulating material, making several levels of electric conducting material, for example metal levels, between the interlayer insulating layers such that portions of at least one of the levels of electric conducting material form masks protecting the one or more pixels upon making the aperture through the layer of electric insulating material. Thus, the step allowing the access to the layer of sacrificial material further enables the one of more pixels of the imager device to be geometrically defined.

The one or more pixels may be made on a substrate comprising the sacrificial material, and the method may further include, between making the one or more pixels and making the aperture through the layer of electric insulating material, the implementation of the steps of:

securing a mechanical handle to a first face of the layer of electric insulating material opposed to a second face of the layer of electric insulating material to which the substrate is secured;

thinning the substrate such that a remaining portion having a thickness equal to about λ/4n forms the layer of sacrificial material;

making the reflective layer and a second substrate against the layer of sacrificial material such that the reflective layer is provided between the layer of sacrificial material and the second substrate;

withdrawing the mechanical handle.

According to an alternative, the one or more pixels may be made on a substrate, and the method may further include, between making the one or more pixels and making the aperture through the layer of electrically insulating material, the implementation of the steps of:

securing a mechanical handle to a first face of the layer of electric insulating material opposed to a second face of the layer of electric insulating material to which the substrate is secured;

removing the substrate;

making the layer of sacrificial material which thickness is equal to about λ/4n, the reflective layer and a second substrate against the second face of the layer of electric insulating material, such that the layer of sacrificial material is provided between the reflective layer and the layer of electric insulating material and the reflective layer is provided between the layer of sacrificial material and the second substrate;

withdrawing the mechanical handle.

The layer of electric insulating material may comprise semiconductor oxide, for example $SiO_2$, and the layer of sacrificial material may be secured to the layer of electric insulating material through a second layer of electric insulating material comprising semiconductor oxide formed beforehand against the layer of sacrificial material.

The method may further include, prior to making the aperture through the layer of electric insulating material, making an etching mask onto the layer of electric insulating material such that portions of the etching mask cover bonding pads electrically connected to the one or more pixels.

The method may further include, after removing at least one part of the layer of sacrificial material through the aperture, filling the optical cavity with at least one gas or material having a refractive index equal to n, forming a medium of the optical cavity.

The sacrificial material may be silicon and/or germanium and/or wherein the layer of electrically insulating material may comprise semiconductor oxide.

The reflective layer may include a stack of at least one etch stop layer comprising a material able to resist to an etching agent used upon removing at least one part of the layer of sacrificial material and at least one reflective layer, the etch stop layer being provided between the reflective layer and the layer of sacrificial material.

The reflective layer is advantageously metallic, but may also be silicon-based.

The etch stop layer may comprise semiconductor oxide and/or the reflective layer may be aluminium-based.

The electromagnetic wave may include a wavelength λ between about 0.5 THz and 10 THz, or advantageously between about 0.5 THz and 1.5 THz.

BRIEF DESCRIPTION OF THE DRAWINGS

The present invention will be better understood upon reading the description of exemplary embodiments given for indicative purpose only and in no way limiting while referring to the appended drawings wherein.

Identical, similar or equivalent parts of the different figures described hereinafter bear the same reference numerals so as to facilitate switching from one figure to another.

Figure 1A:
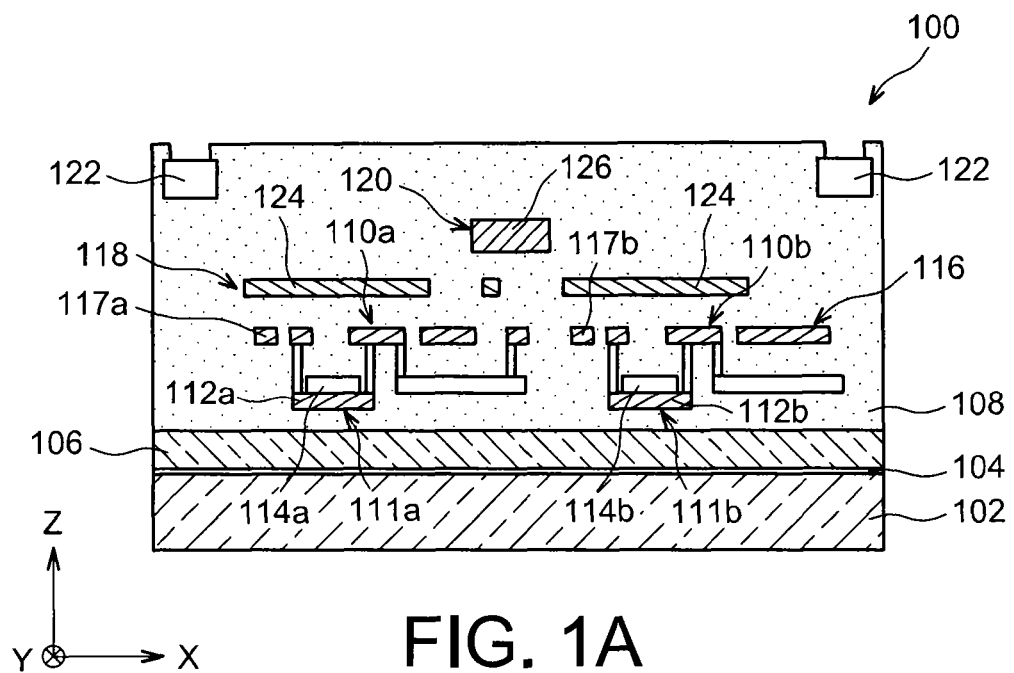
FIGS. 1A to 1D represent steps of a method for making an imager device, object of the present invention, according to a first embodiment.

The different parts shown in the figures are not necessarily drawn at a uniform scale, to make the figures more legible.

The different possibilities (alternatives and embodiments) should be understood as being non-mutually exclusive and can be combined together.

DETAILED DISCLOSURE OF PARTICULAR EMBODIMENTS

We will refer to FIGS. 1A to 1D, which represent the steps of a method for making a THZ imager device 100 according to a first embodiment.

The imager device 100 includes a substrate 102 or wafer, semiconductor-based, for example silicon-based. A reflective layer 104, intended to form electromagnetic wave reflectors under an array of pixels of the imager device 100, is provided on the substrate 102. In this first embodiment, the reflective layer 104 corresponds to an oxide/metal bilayer, made for example of an aluminium layer covered by a $SiO_2$ layer, and the reflective layer of which, herein metallic, is in contact with the substrate 102. Alternatively, the reflective layer 104 can correspond to alternating etched metal layers (for example of aluminium) and dielectric layers (for example oxide such as $SiO_2$), increasing the range of electromagnetic wavelengths that can be reflected by this reflective layer 104. It is also possible that the reflective layer 104 be formed by a single layer of material able to perform both a function of reflecting electromagnetic waves and a function of etch stop (upon etching a layer of sacrificial material 106 provided on the reflective layer 104, as described later), for example comprising aluminium, a $XeF_2$ type etching that can be used for etching silicon of which the layer of sacrificial material 106 is made without attacking the aluminium.

The layer of sacrificial material 106, for example semiconductor-based such as silicon or germanium, is deposited onto the reflective layer 104. Generally, the material of the sacrificial layer 106 is selected such that it can be selectively etched with respect to the material of the reflective layer 104 in contact with the sacrificial material (for example with respect to the oxide when the reflective layer 104 is formed by an oxide/metal bilayer) and possible other materials in contact with parts of the layer of sacrificial material 106 which are intended to be etched subsequently.

The layer of sacrificial material 106 is covered with a layer of electric insulating material 108 such as a dielectric layer, for example comprising $SiO_2$, within which is made in particular the array of pixels of the imager device 100. In FIGS. 1A to 1D, only two pixels 110a and 110b are shown. Each of the pixels 110a, 110b includes a sensor 111a, 111b corresponding for example to a bolometer, a diode or even a transistor. In the first embodiment described herein, each sensor 111a, 111b, includes a MOS type transistor comprising in particular a portion 112a, 112b of a semiconductor active layer (for example of silicon) a part of which (forming the channel of each transistor) is covered by a gate 114a, 114b, herein polysilicon-based. A first level of electric conducting material 116, here corresponding to a first level of metal (generally called METAL 1 or M1), is formed in the dielectric layer 108, above the MOS transistors of the sensors 111a, 111b. This first level of metal 116 is obtained by etching a metal layer for example aluminium-based or tungsten-based, the remaining portions of this metal layer forming the first metal level 116. Metal portions of this first metal level 116 form, in each pixel 110a, 110b, an antenna 117a, 117b electrically connected to the sensor 111a, 111b of the pixel 110a, 110b, through one or several metal vias.

Thus, each pixel of the imager device 100 comprises an antenna able to transform an electromagnetic wave received into heat or electric current. The variation in heat or electric current it then detected by the sensor which is coupled to the antenna.

Second and third levels of electric conducting material, herein metal levels (called METAL 2, or M2, and METAL 3, or M3), referenced 118 and 120 respectively, are also formed in the dielectric layer 108, above the first metal level 116. Each of the metal levels 118 and 120 is for example made from an aluminium-based etched metal layer. Each one of the metal portions of the metal levels 116, 118 and 120 has for example a thickness between about 200 nm and 500 nm.

Finally, bonding pads 122 are also made in the dielectric layer 108, at the periphery of the pixels 110a, 110b so as not to interfere in the electromagnetic waves receipt by the pixels 110a, 110b. These pads 122 are for example obtained from a metal layer having a thickness equal to a few microns (for example 4 μm) and aluminium-based. The bonding pads 122 are in particular electrically connected to the outputs of the sensors 111a, 111b of the pixels 110a, 110b via portions of the different metal levels 116, 118 and 120. Electric links between the different metal levels 116, 118, 120 and with the sensors 111a, 111b and the bonding pads 122 are made with electric conducting vias made in the dielectric layer 108.

In FIGS. 1A to 1D, the dielectric layer 108 is schematically shown as a single layer of electric insulating material. Actually, this layer 108 is formed by superimposing several layers of electric insulating material successively deposited upon making the pixels, covering the different elements of the pixels and the metal levels. The layer 108 is thus formed by superimposing several interlayer insulating layers called ILD ("Inter Layer Dielectric"). The thickness (dimension along the Z axis shown in FIG. 1A) of the dielectric layer 108 is for example equal to about 14 μm.

The different elements of the array of pixels which are described above are for example made by implementing the steps of deposit, photolithography and etching of different layers of materials, corresponding to a MOS type making method.

In addition to the electric interconnecting function provided by some portions of the metal levels 116, 118 and 120, the second metal level 118 is made such that the remaining portions 124 of this second metal layer 118 each form an etching mask, protecting the sensor 111a, 111b and the antenna 117a, 117b of each pixel 110a, 110b during an etching which will be subsequently implemented to etch part of the dielectric layer 108. Likewise, the third metal level 120 is made such that the remaining portions 126 form an etching mask protecting in particular portions of the dielectric layer 108, of the second metal level 118 and the first metal level 116 (and possibly other materials that were used for making the sensors) intended to form, in each pixel 110a, 110b, a frame ensuring mechanical support for the antenna 117a, 117b and the sensor 111a, 111b of the pixel 110a, 110b. Portions of the first metal level 116 can also be used as an etching mask for portions of materials (silicon, polysilicon, dielectric, etc.) located under the same. In the example of FIG. 1A, for each pixel 110a, 110b, portions of the dielectric layer 108 and of polysilicon are protected by a portion of the first metal level 116 in order that, after etching, these portions of materials, or arms, mechanically connect the frame to the assembly including the antenna and the sensor.

Although not shown in FIGS. 1A-1D, the imager device 100 can also include a reading circuit of signals intended to be delivered by the pixel sensors of the imager device 100, made at the array of pixels. This reading circuit can be made for example in CMOS technology. In this case, it can be made simultaneously as the different metal levels (M1, M2, . . . ). This reading circuit can be made next to the pixels, under the bonding pads 122 or next to these pads.

Figure 1B:
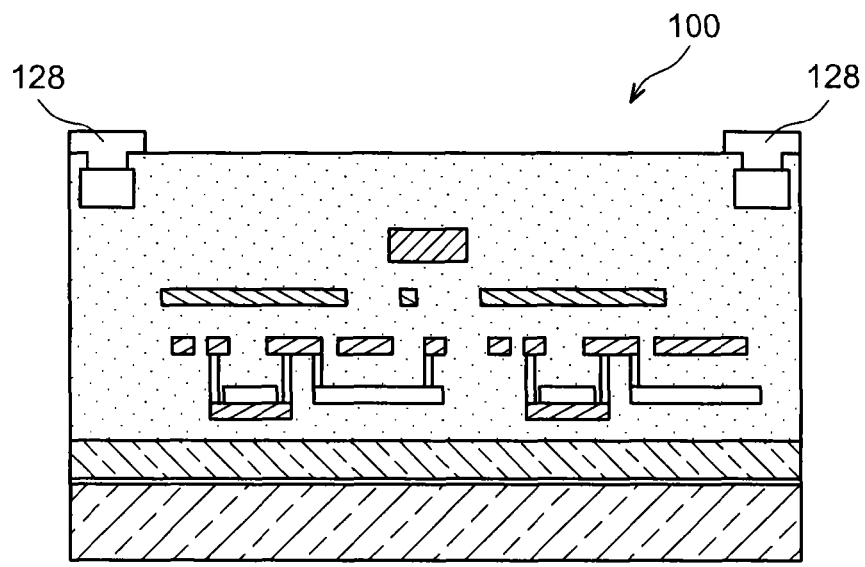

As shown in FIG. 1B, portions of resin 128 are deposited such that they cover and protect the bonding pads 122 with regard to the future etching. If the reading circuit is made next to the bonding pads 122, it can then also be protected by the resin 128.

Figure 1C:
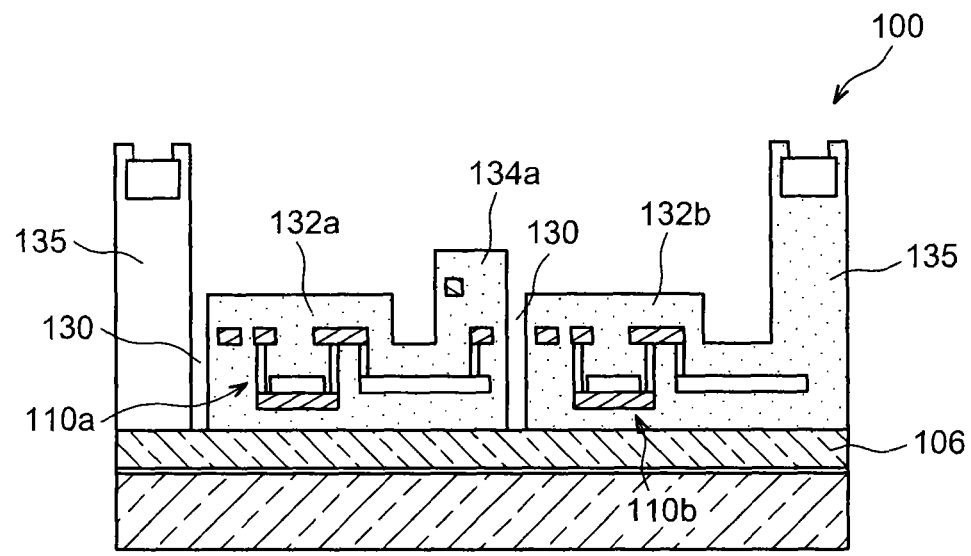

Then, the etching of the dielectric layer 108 is made, for example via a $C_4F_8$ type etching (FIG. 1C). At the areas of the dielectric layer 108 which are not protected by metal portions formed by one of the metal levels in the dielectric layer 108 or by the portions of resin 128, the dielectric layer 108 is then etched throughout its thickness, thus developing parts of the layer of sacrificial material 106. This etching thus enables to make apertures through the dielectric layer 108 forming accesses to the layer of sacrificial material 106. Trenches 130 formed throughout the thickness of the dielectric layer 108 also geometrically define the dielectric material 132a, 132b preserved for the pixels of the imager 100. In FIG. 1C, a frame 134a of the pixel 110a is also shown. Portions of dielectric material 135 are also preserved under the pads 122, forming the frame of all the pixels, that is the frame of the imager 100. At areas protected by portions of the metal levels, only the thickness of dielectric material of the layer 108 located above these metal portions is etched. The antennas 117a, 117b are well encapsulated in the remaining dielectric material because of the protection performed by the metal portions 124 upon etching.

The portions of resin 128 as well as the metal portions developed by etching, that is the metal portions that were used as etching masks, are then withdrawn, for example via the implementation of another etching suitable for the materials to be withdrawn.

Figure 1D:
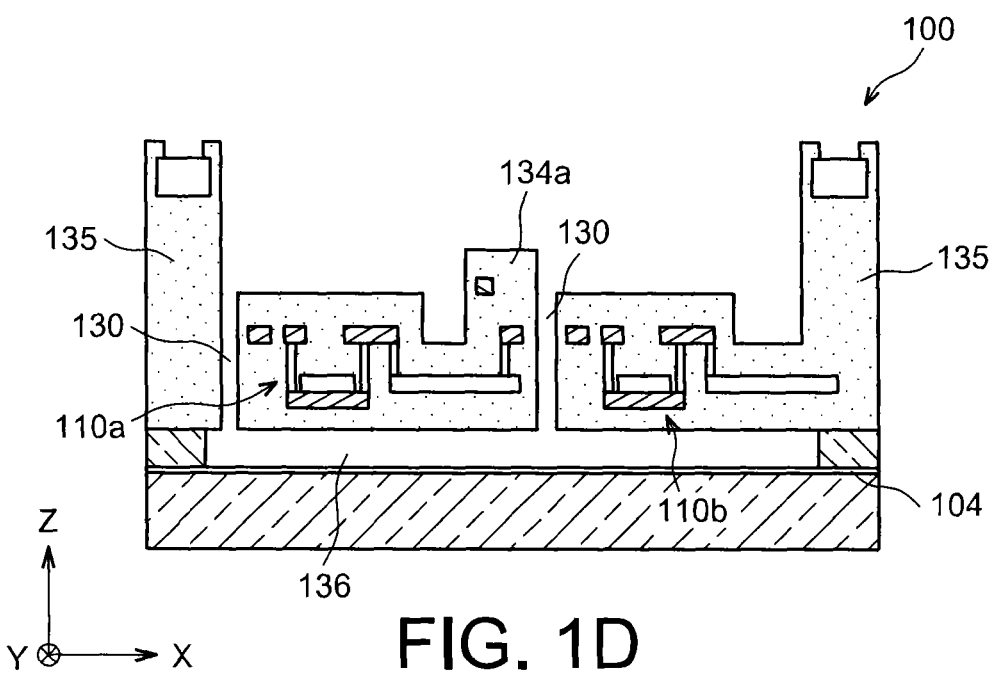

As shown in FIG. 1D, the layer of sacrificial material 106 is then partly etched via the trenches or apertures 130 (partly because parts of the layer of sacrificial material 106 which are not facing the pixels are preserved, in particular parts of the layer of sacrificial material located facing bonding pads 122, under the portions 135 of dielectric material), thus developing the parts of the reflective layer 104 located under the pixels 110a, 110b and forming a reflector under each one of the pixels 110a, 110b of the imager device 100. The reflective layer 104, intended to form reflectors with respect to the pixels of the imager device 100, is also used as an etch stop layer upon etching the layer of sacrificial material 106. When the reflective layer 104 corresponds to an oxide/metal bilayer, the part of this bilayer comprising of oxide and which is located above the part comprising of metal is thus used as an etch stop layer. Generally, the material of the reflective layer 104 which forms the upper part of this layer is selected such that it forms an etch stop material with respect to the sacrificial material of the layer 106. The etching implemented to withdraw the sacrificial material of the layer 106 corresponds for example to an isotropic etching. When the layer of sacrificial material 106 is silicon-based, this isotropic etching can correspond to a $XeF_2$, $CF_4$ or even $SF_6$ type chemical dry etching, or even correspond to a TMAH type wet etching.

The etching of the layer of sacrificial material 106 forms, between the reflective layer 104 and the pixels 110a, 110b of the imager device 100, an optical cavity 136. The thickness, or height, of the optical cavity 136, corresponding to the dimension of the optical cavity 136 along the Z axis shown in FIG. 1D, corresponds to the thickness of the etched layer of sacrificial material 106.

In the example described in connection with FIGS. 1A to 1D, the volume formed by the optical cavity 136 is left empty. Alternatively, it is possible that after the etching of the layer of sacrificial material 106, the optical cavity 136 is filled with a material, in solid or liquid and/or gas form, transparent to the incident wavelength intended to be detected by the imager device 100. This material can be an insulator, semiconductor, organic material or vacuum, as described for example in document WO2010/007266 A1.

The layer of sacrificial material 106 is made with a thickness such that the distance between the reflective layer 104 and the antennas 117a, 117b is equal to about $\lambda/4n$, with n corresponding to the index of the medium (material and/or gas) being in the optical cavity 136 (that is n equal to about 1 when the cavity 136 is not filled with a material after the layer of sacrificial material 106 is etched, and thus when air is present in the optical cavity 136, as is the case in FIG. 1D), and $\lambda$ corresponding to the incident wavelength intended to be detected by the imager device 100. Thus, the reflective layer 104 forms electromagnetic wave reflectors provided at a distance $\lambda/4n$ from the pixels of the imager device 100.

This distance between the antennas and the reflective layer can be approximated by making the reflective layer 104 and the dielectric layer 108 such that they are spaced out by the distance equal to about $\lambda/4n$, by making for this the layer of sacrificial material 106 such that its thickness is equal to about $\lambda/4n$. Indeed, because the height of the optical cavity 136 (dimension along the Z axis), corresponding to the thickness of the layer of sacrificial material 106 and for example equal to about 75 μm, is much higher (for example by a factor of at least 10) than the thickness of the dielectric material, for example of about 1 μm, located between the antennas 117a, 117b and the layer of sacrificial material 106, the phase shift induced by this thickness of dielectric material onto the incident electromagnetic wave is negligible relative to the phase shift of the optical cavity 136.

In this first embodiment, the previously described steps in connection with FIGS. 1A-1D are implemented from a silicon substrate including, prior to making the pixels 110a, 110b, silicon layers 102 and 106 and the buried reflective layer 104. However, it is also possible to make such a substrate after making the pixels 110a, 110b, as described below in connection with the second and third embodiments.

FIGS. 2A to 2D represent steps of a method for making an imager device 200 according to a second embodiment.

Figure 2A:
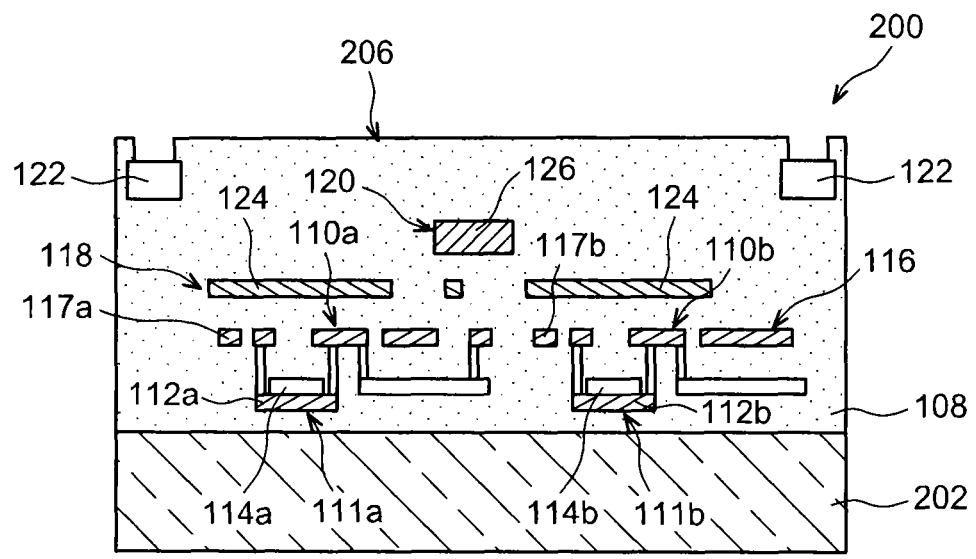
FIGS. 2A to 2D represent part of the steps of a method for making an imager device, object of the present invention, according to a second embodiment.

As shown in FIG. 2A, the elements 108 to 126 previously described in connection with FIG. 1A are made on a substrate 202, or wafer, of the bulk type, for example comprising a semiconductor such as silicon and having a thickness equal to several hundreds of microns, for example between about 500 μm and 700 μm.

Figure 2B:
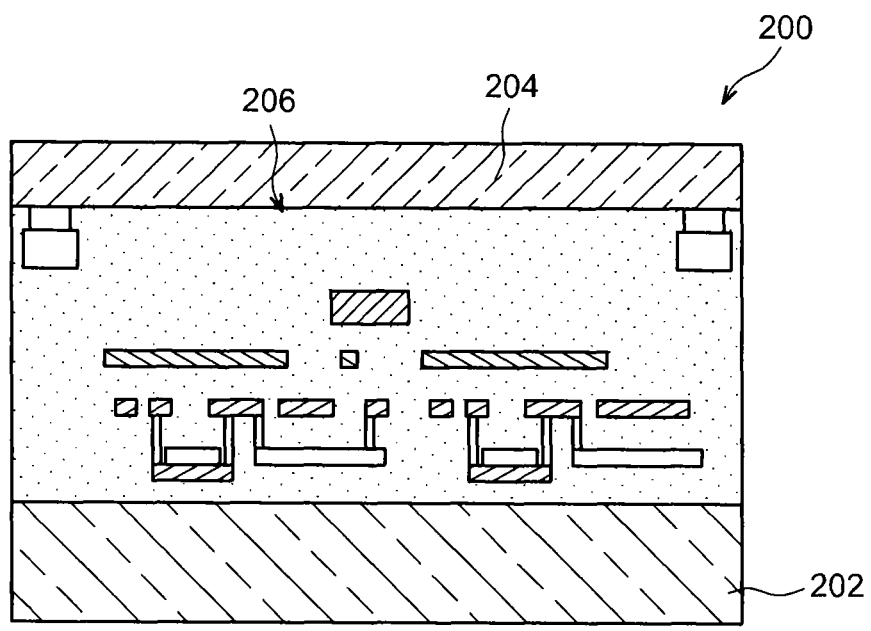

A mechanical handle 204, corresponding for example to another substrate, or wafer, of semiconductor or even glass, is secured to an upper face 206 of the dielectric layer 108 (FIG. 2B).

Figure 2C:
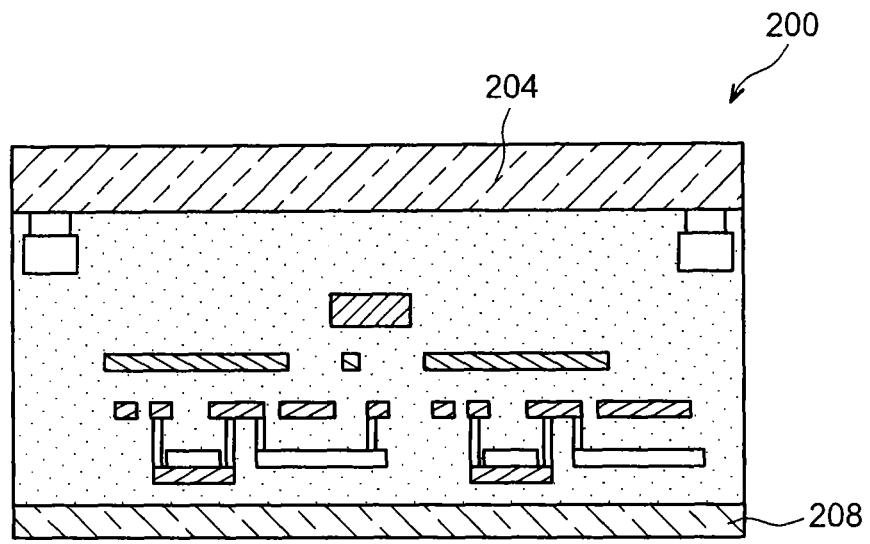
Figure 2D:
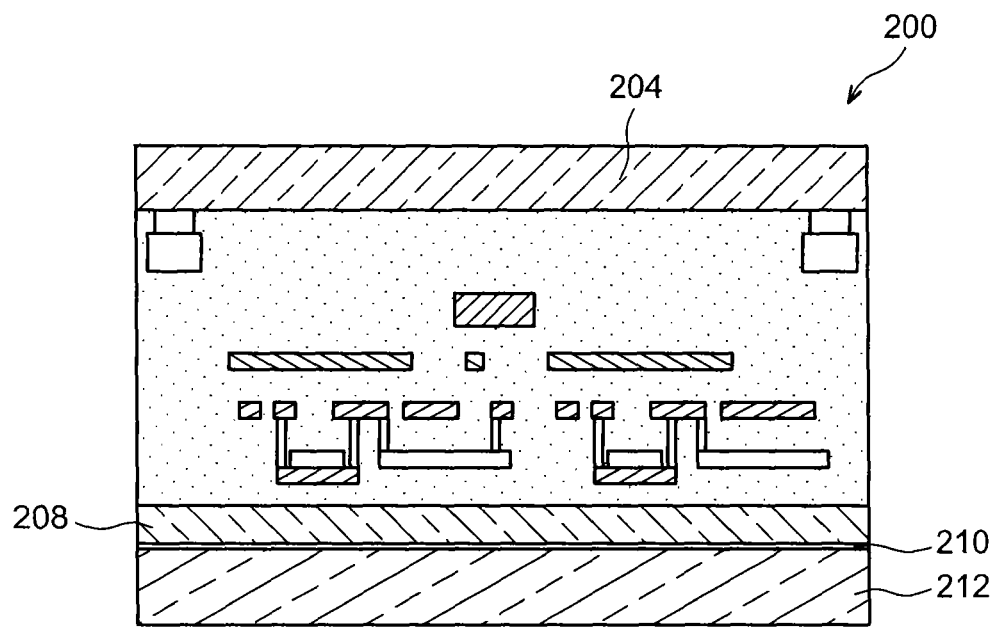

As shown in FIG. 2C, the substrate 202 is then thinned such that a remaining portion of the substrate 202 forms a layer of sacrificial material 208 the thickness of which corresponds to the desired space between the pixels of the imager 200 and the reflectors intended to be made thereafter, for example equal to that of the layer of sacrificial material 106 previously described in the first embodiment. The layer of sacrificial material 208 thus made is similar to the layer of sacrificial material 106 previously described in connection with the first embodiment. During this thinning step, the mechanical handle 204 provides for mechanical support of all the elements of the imager device 200. The thinning can be made through mechanical abrasion.

Finally, another substrate, or wafer, bulk 212, on which a reflective layer 210, for example of metal and that can be similar to the previously described reflective layer 104 is made, is secured to the layer of sacrificial material 208 such that the reflective layer 210 is provided against the layer of sacrificial material 208 (FIG. D).

The mechanical handle 204 is then removed and the making of the imager device 200 is completed by implementing steps similar to those previously described in connection with the FIGS. 1A to 1D, that is steps of masking and etching the dielectric layer 108, defining the geometry of the pixels of the imager device 200 and forming accesses to the layer of sacrificial material 208, and then the etching of part of the layer of sacrificial material 208 in order to develop the reflective layer 210 which then forms reflectors associated with the pixels of the imager device 200.

FIGS. 3A to 3D represent steps of a method for making an imager device 300 according to a third embodiment.

Figure 3A:
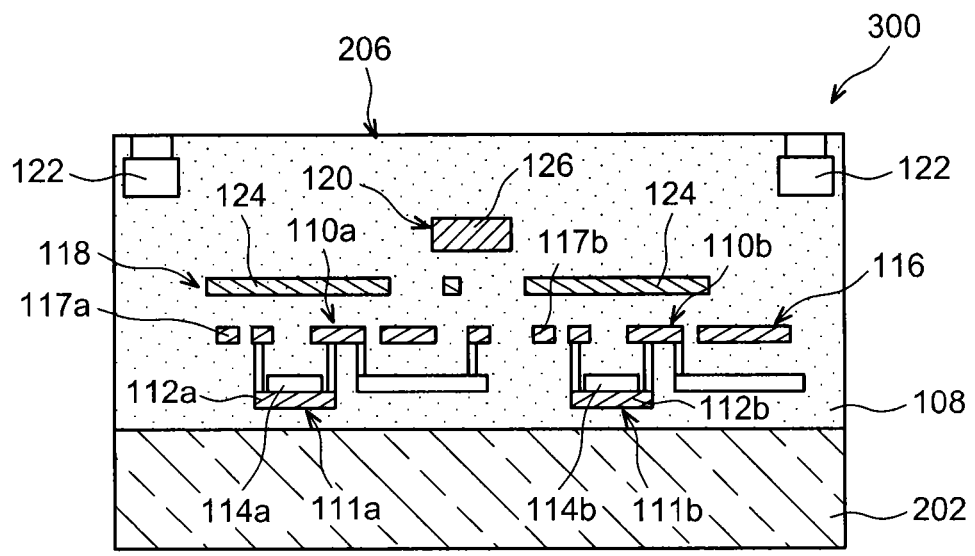
FIGS. 3A to 3D represent part of the steps of a method for making an imager device, object of the present invention, according to a third embodiment.

As shown in FIG. 3A, the elements 108 to 126 previously described in connection with FIG. 1A are made on a substrate 202, for example similar to that previously described in connection with FIG. 2A. However, in this third embodiment, the substrate used can comprise a material other than the sacrificial material intended to form the sacrificial layer which will cover the reflective layer.

Figure 3B:
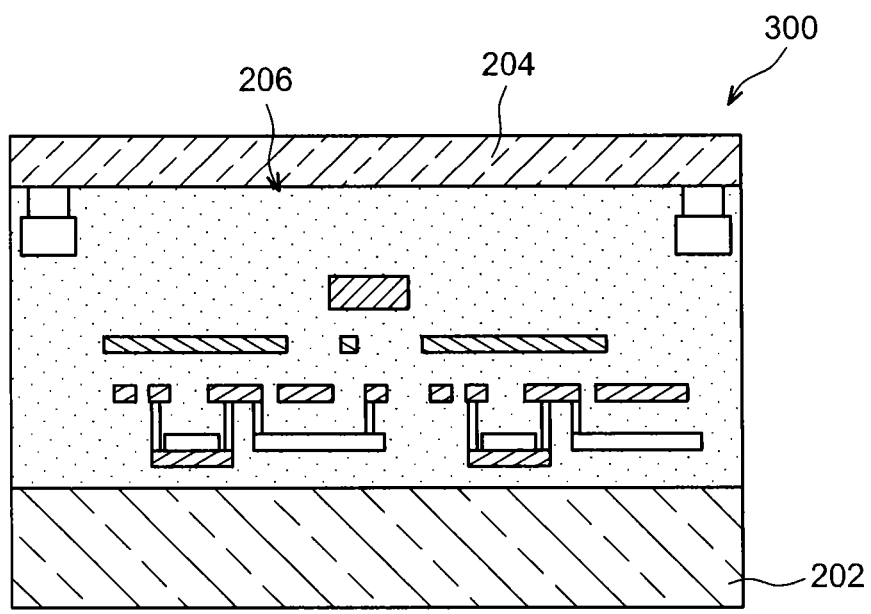

As in the second embodiment, a mechanical handle 204, corresponding for example to a second substrate, or wafer, of semiconductor or even glass, is secured to an upper face 206 of the dielectric layer 108 (FIG. 3B).

Figure 3C:
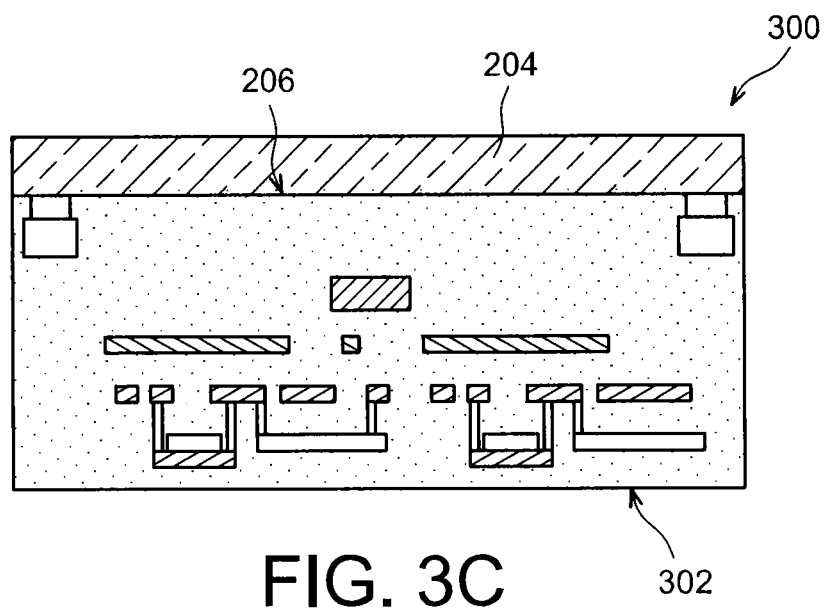

As shown in FIG. 3C, the substrate 202 is then fully thinned, in other words withdrawn, thus developing a back face 302 of the dielectric layer 108. During this step, the mechanical handle 204 provides for the mechanical support of all the elements of the imager device 300. The substrate 202 can then be removed by implementing a first abrasion step withdrawing most of the substrate 202, wherein the remaining material of the substrate 202 can be removed by a TMAH type wet etching.

Figure 3D:
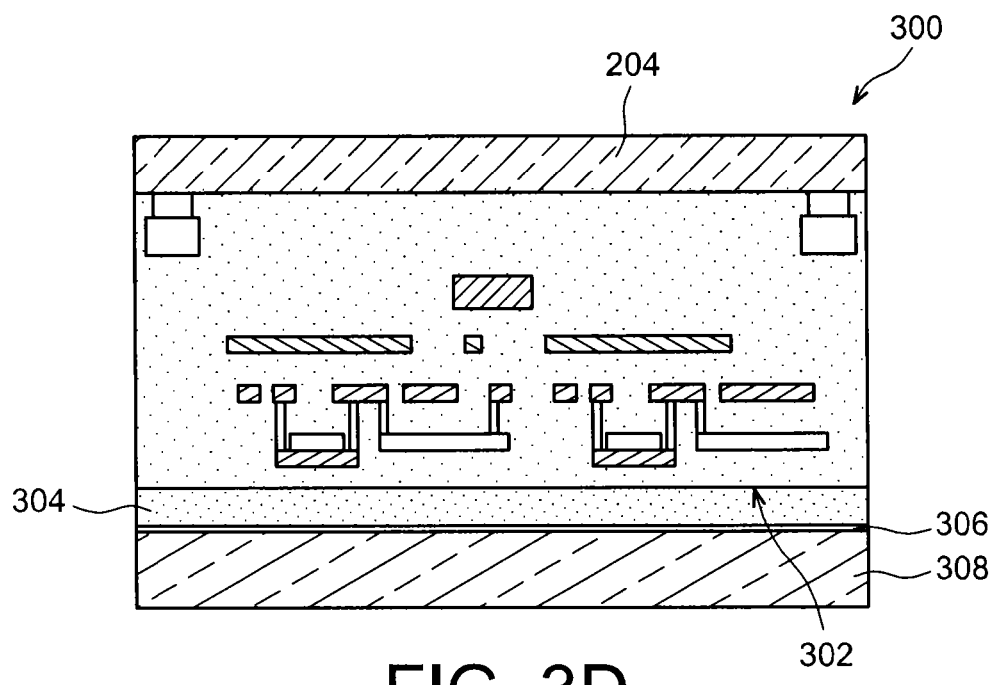

Another wafer including in particular a layer of sacrificial material 307, for example which nature and dimensions are similar to the layers of sacrificial material 106 and 208 previously described, is secured against the back face 302 of the dielectric layer 108 via for example an oxide-oxide bonding (an oxide layer is therefore formed, prior to bonding, onto the layer of sacrificial material 304). This other wafer further includes a reflective layer 306, for example of metal and that can be similar to the reflective layers 104 and 210 previously described, provided against the layer of sacrificial material 304, as well as a substrate, or thick layer, 308 for example silicon-based and secured to the reflective layer 306, providing for mechanical support of the assembly (FIG. 3D).

The mechanical handle 204 is then removed and the making of the imager device 300 is completed by implementing steps similar to those previously described in connection with FIGS. 1A to 1D, that is steps of masking and etching the dielectric layer 108, defining the geometry of the pixels of the imager device 300 and forming accesses to the layer of sacrificial material 304, and then the etching of part of the layer of sacrificial material 304 in order to develop part of the reflective layer 306 which forms reflectors associated with the pixels of the imager device 300.

The previously described methods are particularly suitable for making THz imager devices operating for example in the range of wavelengths between about 0.5 THz and 10 THz, and advantageously between about 0.5 THz and 1.5 THz.

The invention claimed is:

1. A method for making an imager device including at least the implementation of the steps of:
making, through at least one layer of electric insulating material within which are made one or more pixels each including at least one antenna able to pick up at least one electromagnetic wave received at said pixel, of at least an aperture forming an access to at least one layer of sacrificial material provided between the layer of electric insulating material and at least one reflective layer able to reflect said electromagnetic wave;
removing at least part of the layer of sacrificial material through the aperture, forming between the reflective layer and the layer of electric insulating material at least one optical cavity.

2. The method according to claim 1, wherein the reflective layer and the layer of electric insulating material are spaced out by a distance equal to about λ/4n, with n corresponding to the refractive index of a medium in the optical cavity, and λ corresponding to the wavelength of the electromagnetic wave.

3. The method according to claim 1, wherein the antenna of the one or of each pixel is coupled to at least one electronic sensor of said pixel.

4. The method according to claim 3, wherein the electronic sensor of the one or of each pixel includes at least one bolometer, or a diode or a transistor.

5. The method according to claim 1, further including, prior to making the aperture through the layer of electric insulating material, making the one or more pixels in MOS technology.

6. The method according to claim 5, wherein the layer of electric insulating material includes a stack of several interlayer insulating layers.

7. The method according to claim 6, further including, between making the one or more pixels and making the aperture through the layer of electric insulating material, making several levels of electric conducting material between the interlayer insulating layers such that portions of at least one of the levels of electric conducting material form masks protecting the one or more pixels upon making the aperture through the layer of electric insulating material.

8. The method according to claim 5, wherein the one or more pixels are made on a substrate comprising the sacrificial material, and the method further includes, between making the one or more pixels and making the aperture through the layer of electric insulating material, the implementation of the steps of:
securing a mechanical handle to a first face of the layer of electric insulating material opposed to a second face of the layer of electric insulating material to which the substrate is secured;
thinning the substrate such that a remaining portion having a thickness equal to about λ/4n forms the layer of sacrificial material;
making the reflective layer and a second substrate against the layer of sacrificial material such that the reflective layer is provided between the layer of sacrificial material and the second substrate;
withdrawing the mechanical handle.

9. The method according to claim 5, wherein the one or more pixels are made on a substrate, and the method further includes, between making the one or more pixels and making the aperture through the layer of electrically insulating material, the implementation of the steps of:
securing a mechanical handle to a first face of the layer of electric insulating material opposed to a second face of the layer of electric insulating material to which the substrate is secured;
removing the substrate;
making the layer of sacrificial material having a thickness equal to about λ/4n, the reflective layer and a second substrate against the second face of the layer of electric insulating material, such that the layer of sacrificial material is provided between the reflective layer and the layer of electric insulating material and the reflective layer is provided between the layer of sacrificial material and the second substrate;
withdrawing the mechanical handle.

10. The method according to claim 9, wherein the layer of electric insulating material comprises semiconductor oxide and the layer of sacrificial material is secured to the layer of electric insulating material through a second layer of electric insulating material comprising semiconductor oxide formed beforehand against the layer of sacrificial material.

11. The method according to claim 1, further including, prior to the making of the aperture through the layer of electric insulating material, making an etching mask onto the layer of electric insulating material such that portions of the etching mask cover bonding pads electrically connected to the one or more pixels.

12. The method according to claim 1, further including, after removing at least one part of the layer of sacrificial material through the aperture, filling the optical cavity with at least one gas or material having a refractive index equal to n, forming a medium of the optical cavity.

13. The method according to claim 1, wherein the sacrificial material is silicon and/or germanium and/or wherein the layer of electrically insulating material comprises semiconductor oxide.

14. The method according to claim 1, wherein the reflective layer includes a stack of at least one etch stop layer comprising a material able to resist an etching agent used upon removing at least one part of the layer of sacrificial material and at least one reflective layer, the etch stop layer being provided between the reflective layer and the layer of sacrificial material.

15. The method according to claim 14, wherein the etch stop layer comprises semiconductor oxide and/or the reflective layer is aluminium-based.

16. The method according to claim 1, wherein the electromagnetic wave includes a wavelength λ between about 0.5 THz and 10 THz.

* * * * *